(12) United States Patent
Balakrishnan et al.

(10) Patent No.: US 9,865,462 B2
(45) Date of Patent: Jan. 9, 2018

(54) STRAIN RELAXED BUFFER LAYERS WITH VIRTUALLY DEFECT FREE REGIONS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/431,454

(22) Filed: Feb. 13, 2017

(65) Prior Publication Data
US 2017/0229304 A1   Aug. 10, 2017

Related U.S. Application Data

(62) Division of application No. 15/017,844, filed on Feb. 8, 2016, now Pat. No. 9,570,300.

(51) Int. Cl.
*H01L 21/02* (2006.01)
*H01L 29/10* (2006.01)
(Continued)

(52) U.S. Cl.
CPC .... *H01L 21/02694* (2013.01); *H01L 21/0243* (2013.01); *H01L 21/0245* (2013.01);
(Continued)

(58) Field of Classification Search
None
See application file for complete search history.

(56) References Cited

U.S. PATENT DOCUMENTS

| 6,562,703 B1 | 5/2003 | Maa et al. |
| 6,593,625 B2 | 7/2003 | Christiansen et al. |

(Continued)

FOREIGN PATENT DOCUMENTS

| CN | 1711625 A | 12/2005 |
| CN | 100370586 C | 2/2008 |

(Continued)

OTHER PUBLICATIONS

List of IBM Patents or Patent Applications Treated as Related dated Feb. 13, 2017, 2 pages.

*Primary Examiner* — William Coleman
*Assistant Examiner* — Kien Ly
(74) *Attorney, Agent, or Firm* — Scully, Scott, Murphy & Presser, P.C.; Louis J. Percello, Esq.

(57) ABSTRACT

A strain relaxed buffer layer of a second semiconductor material and of a second lattice constant and containing misfit dislocation defects and threading dislocation defects is formed atop a surface of a first semiconductor material of a first lattice constant that differs from the second lattice constant. The surface of the first semiconductor material includes at least one recessed region and adjoining non-recessed regions. An anneal is then performed on the strain relaxed buffer layer to propagate and amass the misfit dislocation defects and threading dislocation defects at a sidewall of each of the non-recessed regions of the first semiconductor material.

16 Claims, 4 Drawing Sheets

(51) Int. Cl.
*H01L 29/165* (2006.01)
*H01L 29/32* (2006.01)

(52) U.S. Cl.
CPC .... *H01L 21/02381* (2013.01); *H01L 29/1054* (2013.01); *H01L 29/165* (2013.01); *H01L 29/32* (2013.01)

(56) References Cited

U.S. PATENT DOCUMENTS

| | | | |
|---|---|---|---|
| 6,709,903 B2 | 3/2004 | Christiansen et al. | |
| 6,855,436 B2 | 2/2005 | Bedell et al. | |
| 6,921,914 B2 | 7/2005 | Cheng et al. | |
| 7,273,800 B2 | 9/2007 | Boyd et al. | |
| 8,274,097 B2 | 9/2012 | Cheng | |
| 8,823,056 B2 | 9/2014 | Leitz et al. | |
| 9,006,705 B2 | 4/2015 | Eneman et al. | |
| 9,305,781 B1 | 4/2016 | Mochizuki et al. | |
| 9,318,491 B2* | 4/2016 | Cantoro | H01L 27/0924 |
| 9,419,079 B1 | 8/2016 | Reznicek | |
| 9,660,085 B2* | 5/2017 | Then | H01L 29/785 |
| 2002/0089032 A1 | 7/2002 | Huang | |
| 2002/0185686 A1 | 12/2002 | Christiansen et al. | |
| 2003/0218189 A1 | 11/2003 | Christiansen et al. | |
| 2005/0054175 A1* | 3/2005 | Bauer | H01L 21/02381 438/404 |
| 2007/0278517 A1 | 12/2007 | Boyd et al. | |
| 2010/0181576 A1* | 7/2010 | Wuu | C30B 25/183 257/76 |
| 2011/0180847 A1* | 7/2011 | Ikeda | H01L 29/045 257/190 |
| 2012/0326210 A1 | 12/2012 | Shi | |
| 2015/0194523 A1* | 7/2015 | Kim | H01L 29/7848 257/192 |
| 2015/0263095 A1* | 9/2015 | Chan | H01L 29/155 257/17 |
| 2016/0359004 A1* | 12/2016 | Su | H01L 21/02458 |

FOREIGN PATENT DOCUMENTS

| | | |
|---|---|---|
| CN | 102254829 A | 11/2011 |
| CN | 102254829 B | 12/2012 |
| KR | 101503000 B1 | 3/2015 |

* cited by examiner

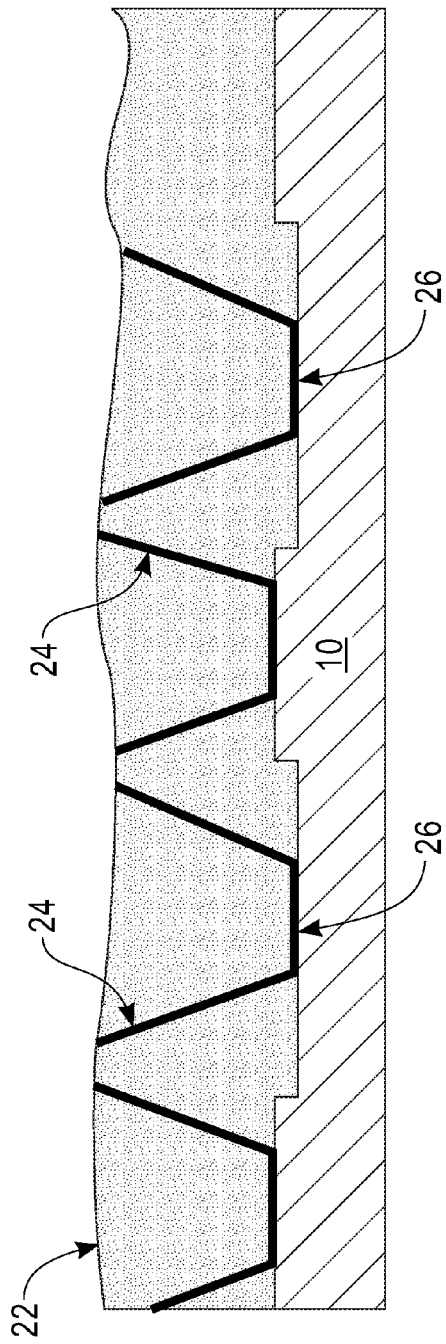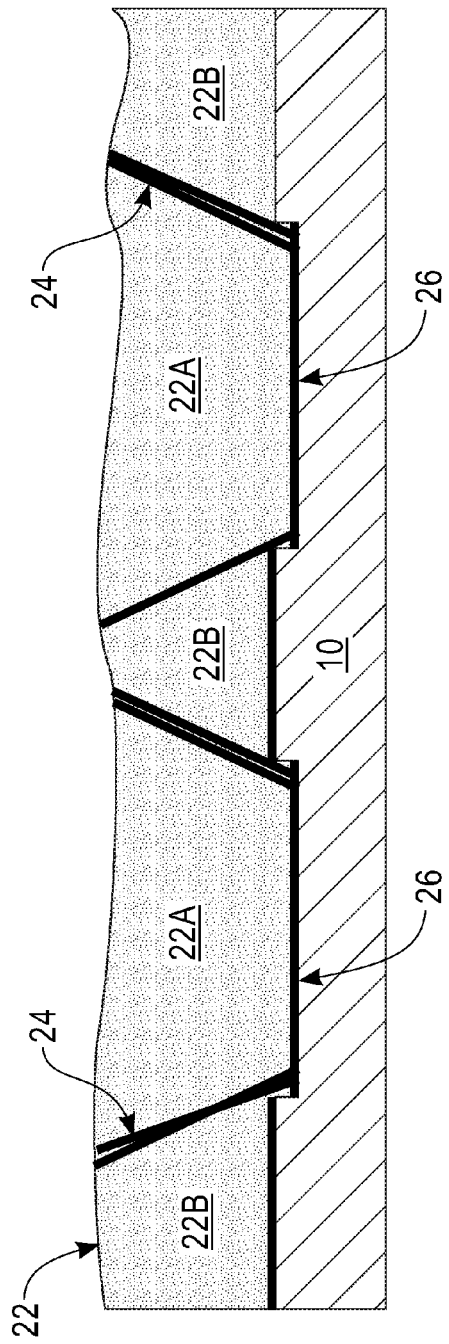

STRAIN RELAXED BUFFER LAYERS WITH VIRTUALLY DEFECT FREE REGIONS

BACKGROUND

The present application relates to a semiconductor structure and a method of forming the same. More particularly, the present application relates to a semiconductor structure containing a strain relaxed buffer layer that contains regions that are essentially defect free, and a method of forming the same.

Strain relaxed buffer (SRB) layers are needed for strained channel complementary metal oxide semiconductor (CMOS) devices. As an example, a silicon germanium alloy (i.e., SiGe) SRB layer is used for growing tensily-strained silicon (Si) channels for n-channel field effect transistors (i.e., nFETs), and compressively-stained germanium or high-germanium percentage SiGe channels for p-channel field effect transistors (i.e., pFETs). Usually, a very thick SRB layer is needed to ensure low defect density in the channel region of such FETs. Typical, SRB layer thickness is in the micron (μm) range.

Another approach for obtaining low defect density involves implant anneal buffer/strain relaxed buffer layers (IAB/SRB layers). Such structures are currently a preferred approach for 7 nm node technology, enabling the attainment of dual channel material FinFETs on the same substrate. One of the challenges with the IAB/SRB layer process is that the defect density at the surface buffer layer is in the $1\times10^5$ range even for the best known structures. This level of defect density is far too high to achieve high performance CMOS fabrication.

SUMMARY

A strain relaxed buffer layer of a second semiconductor material and of a second lattice constant and containing misfit dislocation defects and threading dislocation defects is formed atop a surface of a first semiconductor material of a first lattice constant that differs from the second lattice constant. The surface of the first semiconductor material includes at least one recessed region and adjoining non-recessed regions. An anneal is then performed on the strain relaxed buffer layer to propagate and amass the misfit dislocation defects and threading dislocation defects at a sidewall of each of the non-recessed regions of the first semiconductor material.

In one aspect of the present application, a method of forming a semiconductor structure is provided. In one embodiment of the present application, the method includes providing a first semiconductor material of a first lattice constant, the first semiconductor material having a surface containing at least one recessed region and non-recessed regions adjoining the at least one recessed region. A second semiconductor material of a second lattice constant that is different from the first lattice constant is then formed on the surface of the first semiconductor material. Due to the difference in lattice constants, the second semiconductor material is strained. Next, the second semiconductor material that is strained is converted into a strain relaxed buffer layer. The strain relaxed buffer layer contains misfit dislocation defects and threading dislocation defects. An anneal is then performed on the strain relaxed buffer layer to propagate and amass the misfit dislocation defects and threading dislocation defects at a sidewall of each of the non-recessed regions of the first semiconductor material.

In another aspect of the present application, a semiconductor structure is provided. In one embodiment of the present application, the semiconductor structure includes a first semiconductor material of a first lattice constant. The first semiconductor material has a surface containing at least one recessed region and non-recessed regions adjoining the at least one recessed region. The structure of the present application further includes a strain relaxed buffer layer comprising a second semiconductor material having a second lattice constant that is different from the first lattice constant. The strain relaxed buffer layer contains a first region located directly above the at least one recessed region of the first semiconductor material, and second regions that are located directly above each non-recessed region of the first semiconductor material. Each first region has a first threading dislocation defect density and each second region has a second threading dislocation defect density that is greater than the first threading dislocation defect density.

BRIEF DESCRIPTION OF SEVERAL VIEWS OF THE DRAWINGS

FIG. 4 is a cross sectional view of the exemplary semiconductor structure of FIG. 3 after performing a strain relaxation anneal which converts the second semiconductor material into a strain relaxed buffer layer.

FIG. 5 is a cross sectional view of the exemplary semiconductor structure of FIG. 4 after further annealing.

DETAILED DESCRIPTION

Figure 1A:
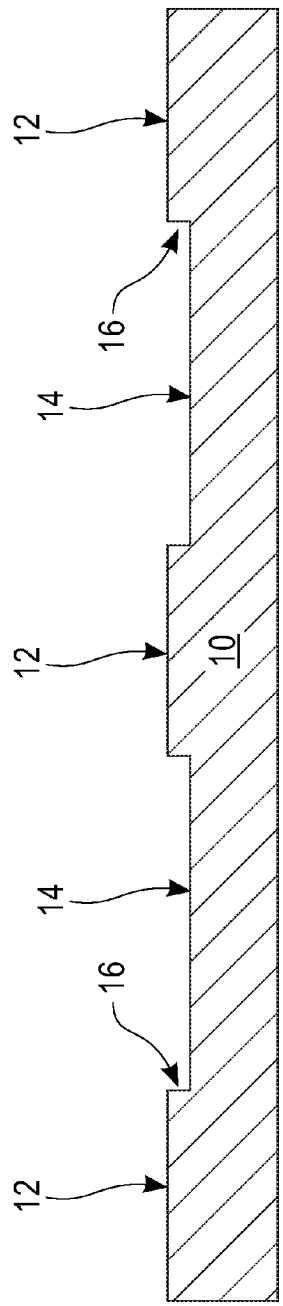
FIG. 1A is a cross sectional view of an exemplary semiconductor structure that can be employed in one embodiment of the present application and including a first semiconductor material of a first lattice constant, the first semiconductor material having a surface containing at least one recessed region and non-recessed regions adjoining the at least one recessed region.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
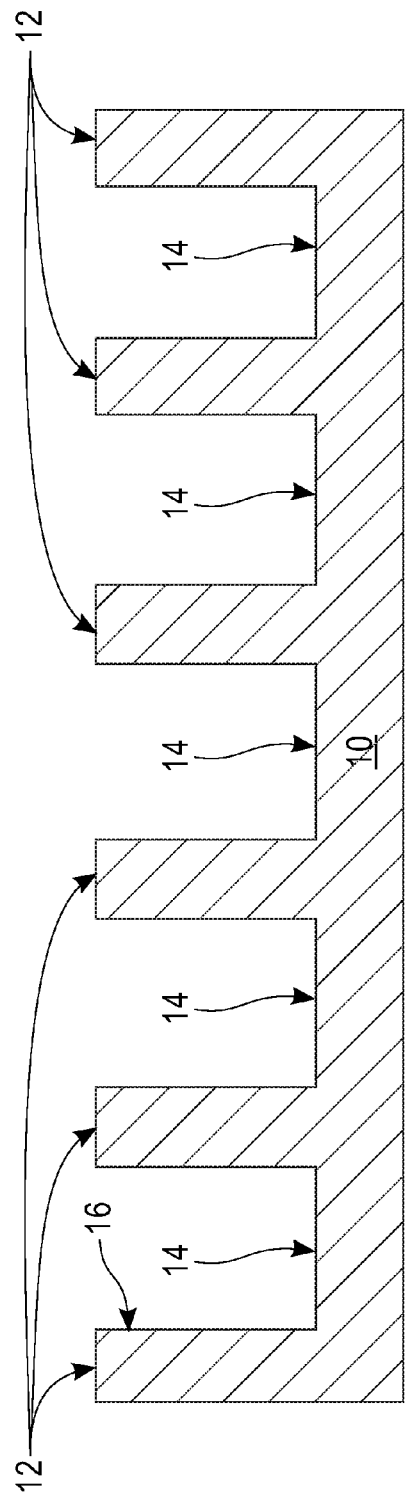
FIG. 1B is a cross sectional view of an exemplary semiconductor structure that can be employed in another embodiment of the present application and including a first semiconductor material of a first lattice constant, the first semiconductor material having a surface containing at least one recessed region and non-recessed regions adjoining the at least one recessed region.

Referring first to FIGS. 1A-1B, there are illustrated exemplary semiconductor structures that can be employed in the present application. The exemplary semiconductor structures of FIGS. 1A-1B each include a first semiconductor material 10 of a first lattice constant and a surface containing at least one recessed region 14 and non-recessed regions 12 adjoining the at least one recessed region 14. Each of the recessed regions 14 ends at a sidewall 16 of the non-recessed regions. The sidewall 16 determines a height between the recessed region 14 and the non-recessed region 12. The present application is not limited to the exact exemplary semiconductor structures shown in FIGS. 1A-1B. Instead, other exemplary semiconductor structures can be employed so long as the other exemplary semiconductor structures include a first semiconductor material 10 that has a least one recessed region 14 and adjoining non-recessed regions 12.

The number of non-recessed regions 12 and recessed regions 14 that can be present in the first semiconductor material 10 can vary and is not critical in practicing the method of the present application. Also, the height of each non-recessed region 12 and spacing between each non-recessed region 12 may vary and are not critical in practicing the method of the present application. In one example, the height between each recessed region 14 and each non-recessed region 12 may be from 10 nm to 100 nm.

FIG. 1A shows an embodiment in which each non-recessed region 12 has a height that is less than the height of each non-recessed region 12 shown in FIG. 1B. Each non-recessed region 12 shown in FIG. 1A may be referred to as a mesa, while each non-recessed region 12 shown in FIG. 1B may be referred to herein as a pillar.

The geometrical shape of each recessed region 14 of the first semiconductor material 10 may vary and can be, for example, circular, triangular, or a parallelogram having four sides including, for example, rectangles, squares, rhombi or trapezoids. In some embodiments, and as is shown, the geometrical shape of each recessed region 14 of the first semiconductor material 10 may all be the same. In other embodiments, a geometrical shape of at least one of the recessed regions 14 is different from the geometrical shape of at least one other recessed region 14.

Although the drawings illustrate an embodiment in which each recessed region 14 has a same depth such that the topmost surfaces of each recessed region 14 are coplanar with each other, the present application also contemplates embodiments in which a topmost surface of at least one of the recessed regions 14 is not coplanar with a topmost surface of at least one other recessed region 14. Thus, and stated in different terms, at least one of the recessed regions 14 may have a different depth than at least one other recessed region 14.

Likewise and although the drawings illustrate an embodiment in which each non-recessed region 12 has a same height such that the topmost surfaces of each non-recessed region 12 are coplanar with each other, the present application also contemplates embodiments in which a topmost surface of at least one of the non-recessed regions 12 is not coplanar with a topmost surface of at least one other non-recessed region 12. Thus, and stated in different terms, at least one of the non-recessed regions 12 may have a different height than at least one other non-recessed region 12.

The first semiconductor material 10 that can be employed in the present application includes any semiconductor material having semiconducting properties. Examples of semiconductor materials that may be employed as the first semiconductor material 10 include, but are not limited to, silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In one embodiment of the present application, the first semiconductor material 10 may be a single crystalline semiconductor material. The semiconductor material that provides the first semiconductor material 10 may have any of the well known crystal orientations. For example, the crystal orientation of the first semiconductor material 10 may be {100}, {110}, or {111}. Other crystallographic orientations besides those specifically mentioned can also be used in the present application.

The exemplary semiconductor structures shown in FIGS. 1A-1B can be formed by first providing a non-patterned first semiconductor material 10. A surface of the non-patterned first semiconductor material 10 may then be patterned to form the at least one recessed region 14 with the first semiconductor material 10.

In one embodiment of the present application, the patterning process used to define the exemplary semiconductor structures shown in FIGS. 1A-1B may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. After etching, the patterned photoresist can be removed utilizing any photoresist stripping process such as, for example, ashing.

In another embodiment, the patterning process may include a sidewall image transfer (SIT) process. In yet another embodiment, the patterning process may include a direct self-assembly (DSA) patterning process.

Figure 2:
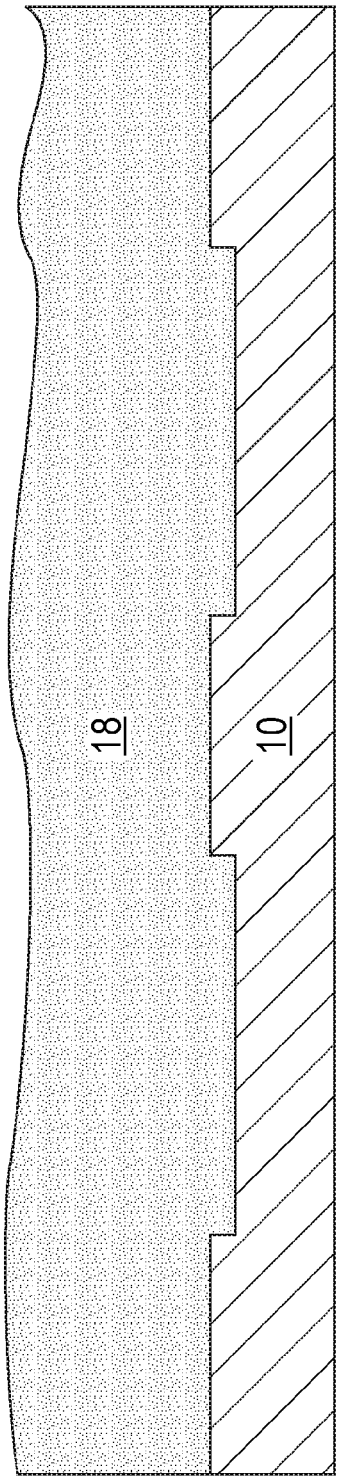
FIG. 2 is a cross sectional view of the exemplary semiconductor structure of FIG. 1A after forming a second semiconductor material of a second lattice constant that is different from the first lattice constant on the surface of the first semiconductor material.

Referring now to FIG. 2, there is illustrated the exemplary semiconductor structure of FIG. 1A after forming a second semiconductor material 18 of a second lattice constant that is different from the first lattice constant on the surface of the first semiconductor material 10 that includes the recessed regions 14 and the non-recessed regions 12. Although the exemplary semiconductor structure shown in FIG. 1A is described and illustrated, other exemplary semiconductors such as that shown in FIG. 1B, can also be employed. An interface is formed between the first semiconductor material 10 and the second semiconductor material 18 at the surface containing the recessed regions 14 and the non-recessed regions 12.

The second semiconductor material 18 may include one the semiconductor materials mentioned above for the first semiconductor material 10 provided the semiconductor material that provides the second semiconductor material 18 is different from the semiconductor material that provides the first semiconductor material 10. In one embodiment of the present application, the first semiconductor material 10 may be composed of silicon, while the second semiconductor material 18 may be composed of a silicon germanium alloy. In such an embodiment, the silicon germanium alloy may include a germanium content of from 20 atomic percent germanium to 30 atomic percent germanium. Other germanium contents that are lesser than 20 atomic percent germanium, or greater than 30 atomic germanium, can also be used for the silicon germanium alloy that provides the second semiconductor material 18.

As mentioned above, the second semiconductor material 18 has a second lattice constant that differs from the first lattice constant. In one embodiment, the second lattice constant is greater than the first lattice constant. In another embodiment, the second lattice constant is less than the first lattice constant. In either embodiment, the second semiconductor material 18 is a strained semiconductor material. The strain may be tensile or compressive.

The second semiconductor material 18 is a blanket layer that covers an entirety of the surface of the first semiconductor material 10 containing the recessed regions 14 and the non-recessed regions 12. The second semiconductor material 18 can be formed by an epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, the second semiconductor material 18 thus has an epitaxial relationship with the surface of the first semiconductor material 10 that contains the recessed regions 14 and the non-recessed regions 12.

Examples of various epitaxial growth process apparatuses that are suitable for use in forming the second semiconductor material 18 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

A number of different sources may be used for the deposition of the second semiconductor material 18. In some embodiments and when the second semiconductor material 18 is composed of a silicon germanium alloy, the source gas for the deposition the second semiconductor material 18 may include an admixture of a silicon containing gas source and a germanium containing gas source. Examples of silicon gas sources include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium gas sources include germane, digermane, halogermane, dichlorogermane, trichlorogermane, tetrachlorogermane and combinations thereof. In some embodiments and when the second semiconductor material 18 is also composed of a silicon germanium alloy, the second semiconductor material 18 can be formed from a source gas that includes a compound containing silicon and germanium. Other source gases or gases mixtures that are known to those skilled in the art can also be used in forming the second semiconductor material 18. Carrier gases like hydrogen, nitrogen, helium and argon can be used.

In one embodiment of the present application, the thickness of the second semiconductor material 18 may be from 100 nm to 2000 nm. Other thicknesses are possible so long as the epitaxially grown second semiconductor material 18 is a strained semiconductor material.

Figure 3:
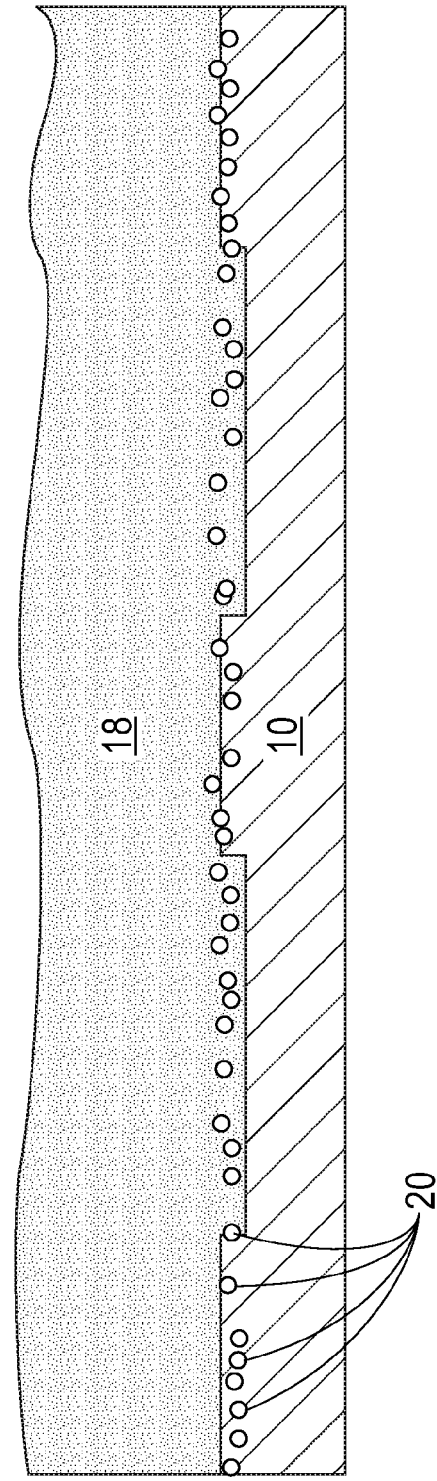
FIG. 3 is a cross sectional view of the exemplary semiconductor structure of FIG. 2 after forming a plurality of ion-induced defects proximate an interface formed between the first and second semiconductor materials.

Referring now to FIG. 3, there is shown the exemplary semiconductor structure of FIG. 2 after forming a plurality of ion-induced defects 20 proximate an interface formed between the first and second semiconductor materials 10, 18. In some embodiments of the present application, the ion-induced defects 20 are in the form of bubbles. In other embodiments of the present application, the ion-induced defects 20 are in the form of platelets. In either embodiment, the ion-induced defects 20 contain nucleation centers in which misfit dislocations and threading dislocations can form during a subsequently performed strain relaxation anneal.

In some embodiments of the present application, and as shown in FIG. 3, the plurality of ion-induced defects 20 may be present in a bottom portion of the second semiconductor material 18 that fills each recessed regions 14, at the sidewalls 16 of the first semiconductor material 10, and within an upper portion of the non-recessed region 12 of the first semiconductor material 10. Misfit dislocations are defects that are formed along an interface between two materials that have different lattice constants, while threading dislocations are defects that are unwanted by-products of misfit dislocations that extend to the topmost surface of a material.

The plurality of ion-induced defects 20 can be formed by implanting ions through the topmost surface of the second semiconductor material 18. The ion implantation used to form the ion-induced defects 20 in the present application may include atoms of, for example, helium (He), hydrogen (H), or argon (Ar). Combinations of atoms may also be employed in forming the plurality of ion-induced defects 20 within the structure shown in FIG. 2. Other atoms that are capable of forming ion-induced defects 20 containing the above described nucleation centers can also be employed in the present application. The ion implantation used to form the ion-induced defects 20 employs implant energies that are well known to those skilled in the art. In one example, the implant energy used to form the ion-induced defects 20 can be from 5 keV to 10 keV. The implant energy depends on the thickness of the second semiconductor material 18 and the pillar/mesa height, also on the species chosen. The ion implantation used to form the ion-induced defects 20 can include ion dosages that are well known to those skilled in the art. In one example, the ion dosage used to form the ion-induced defects 20 may range from $5 \times 10^{15}$ atoms/cm$^2$ to $3 \times 10^{16}$ atoms/cm$^2$. The number and size of the ion-induced defects 20 that are formed may vary depending on the ion implantation conditions employed to form the ion-induced defects 20.

Referring now to FIG. 4, there is illustrated the exemplary semiconductor structure of FIG. 3 after performing a strain relaxation anneal in which misfit dislocations 26 and threading dislocations 24 are formed from the above mentioned nucleation centers contained in the ion-induced defects 20. The threading dislocations 24 originate from a surface of the misfit dislocations 26. During the strain relaxation anneal, these defects (24, 26) begin to propagate within the second semiconductor material 18 and a sufficient quantity of the misfit dislocations 26 is formed that effectuates strain relaxation of the strained second semiconductor material 18.

The strain relaxed second semiconductor material may now be referred to as a strain relaxed buffer layer 22. The strain relaxed buffer layer 22 includes the semiconductor material that provides the second semiconductor material 18 as well as defects mentioned above. At this point of the present application, and as shown in FIG. 4, the location of the threading dislocations 24 that extend to the uppermost surface of the strain relaxed buffer layer 22 is not well controlled and thus the strain relaxed buffer layer 22 is typically too defective to be employed as a semiconductor device layer.

The degree of relaxation may vary depending on the type of semiconductor material employed as the second semiconductor material 18 as well as the thickness of the second semiconductor material. In one embodiment of the present application, and for a silicon germanium alloy layer having a thickness within the range mentioned above for the second semiconductor material 18, the threading dislocations 24 that are generated may relieve about 80 percent to 100 percent of a compressive strain within the silicon germanium alloy layer.

In one embodiment of the present application, the strain relaxation anneal may include a thermal anneal. Other annealing processes such as a laser anneal or a microwave anneal may also be employed in the present application so long as the anneal effectuates strain relaxation of the strained second semiconductor material layer 18. The strain relaxation anneal may be performed in an inert ambient including, but not limited to, helium and/or argon. The strain relaxation anneal may be performed at a temperature from 800° C. to 1050° C.; other temperatures are possible so long as the selected anneal temperature effectuates strain relaxation of the strained second semiconductor material layer 18. The strain relaxation anneal may be performed for a duration of from 2 minutes to 60 minutes; other durations are possible so long as the selected duration effectuates strain relaxation of the strained second semiconductor material layer 18. In some embodiments, the strain relaxation anneal may be performed utilizing various ramp and soak cycles. In other embodiments, the strain relaxation anneal may include a single ramp up to a predefined strain relaxation anneal temperature and then cooling the exemplary semiconductor structure from the predefined strain relaxation anneal temperature (e.g., 800° C. to 1050° C.) to a lower temperature (e.g., 400° C. to 700° C.).

Referring now to FIG. 5, there is shown the exemplary semiconductor structure of FIG. 4 after further annealing. The further annealing may be an extension of the strain relaxation anneal as mentioned above, or a separate anneal that is performed after performing the strain relaxation anneal and cooling down to nominal room temperature (i.e., 20° C. to 30° C.). The further anneal may include any of the annealing processes mentioned above. Also, the further anneal may include any of the conditions (i.e., inert ambients, temperature and duration) as mentioned above.

During the further anneal, the propagation of the defects (24, 26) within the strain relaxed buffer layer 22 continues and the defects (24, 26) pile-up (i.e., amass) and get trapped at the sidewalls 16 of the first semiconductor material 10. As is shown in FIG. 5, the further anneal provides a strain relaxed buffer layer 22 containing a first region 22A that is located directly above each recessed region 14 of the first semiconductor material 10 that has a first threading dislocation defect density, while a second region 22B that is located directly above the non-recessed region 12 of the first semiconductor material 10 that has a second threading dislocation defect density that is greater than the first threading dislocation defect density. Each first region 22A of the strain relaxed buffer layer 22 may be referred to herein as a virtually threading dislocation free region, while each second region 22B may be referred to herein as a threading dislocation containing region. Each first region 22A can be used as a semiconductor device region in which one of more semiconductor devices such as, for example, FETs, can be subsequently formed.

In one embodiment of the present application, the first threading dislocation defect density of each first region 22A of the strain relaxed buffer layer 22 may be less than 100/cm$^2$. In another embodiment, the first threading dislocation defect density of each first region 22A of the strain relaxed buffer layer 22 is from 100/cm$^2$ to 1/cm$^2$. In one embodiment of the present application, the second threading dislocation defect density of each second region 22B of the strain relaxed buffer layer 22 may be greater than $1 \times 10^6$/cm$^2$. In another embodiment, the second threading dislocation defect density of each second region 22B of the strain relaxed buffer layer 22 is from $1 \times 10^6$/cm$^2$ to $1 \times 10^{11}$/cm$^2$.

Figure 6:
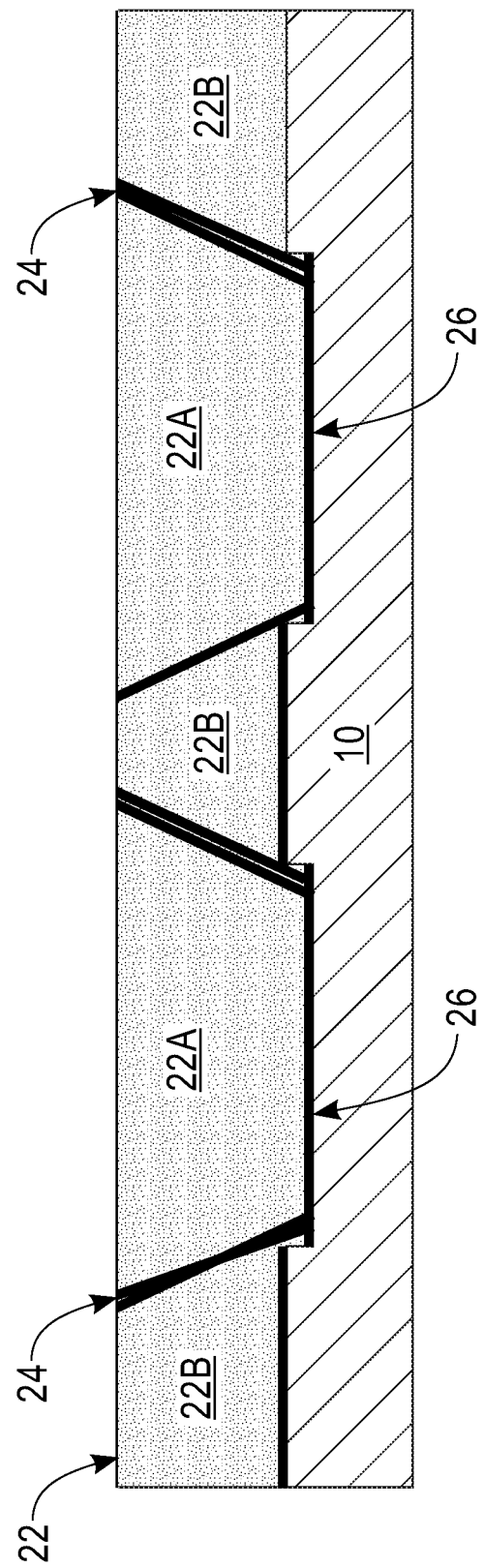
FIG. 6 is a cross sectional view of the exemplary semiconductor structure of FIG. 5 after performing a planarization process on the strain relaxed buffer layer.

Referring now to FIG. 6, there is illustrated the exemplary semiconductor structure of FIG. 5 after performing a planarization process on the strain relaxed buffer layer 22. The planarization process provides a strain relaxed buffer layer having a topmost surface that is entirely planar from one edge of the strain buffer layer 22 to another edge of the strain relaxed buffer layer 22. In one embodiment, the planarization process may include, for example, a chemical mechanical planarization process. In another embodiment, a grinding process may be used to planarization the upper portion of the strain relaxed buffer layer 22.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a first semiconductor material of a first lattice constant, said first semiconductor material having a surface containing at least one recessed region and non-recessed regions adjoining said at least one recessed region; and
a strain relaxed buffer layer comprising a second semiconductor material having a second lattice constant that is different from said first lattice constant, wherein said strain relaxed buffer layer contains a first region located directly above said at least one recessed region of said first semiconductor material, and a second region that is located directly above each non-recessed region of said first semiconductor material, and wherein each first region has a first threading dislocation defect density and each second region has a second threading dislocation defect density that is greater than said first threading dislocation defect density, and wherein said strain relaxed buffer layer contains misfit dislocation defects and threading dislocation defects amassed at a sidewall of each of said non-recessed regions of said first semiconductor material.

2. The semiconductor structure of claim 1, wherein said first threading dislocation defect density is less than 100/cm$^2$.

3. The semiconductor structure of claim 2, wherein said second threading dislocation defect density is greater than $1\times10^6$/cm$^2$.

4. The semiconductor structure of claim 1, wherein said second lattice constant of said second semiconductor material is greater than said first lattice constant of said first semiconductor material.

5. The semiconductor structure of claim 4, wherein said second semiconductor material is a silicon germanium alloy and said first semiconductor material is silicon.

6. The semiconductor structure of claim 5, wherein said silicon germanium alloy has a germanium content of from 20 atomic percent to 30 atomic percent.

7. The semiconductor structure of claim 1, wherein said second lattice constant of said second semiconductor material is less than said first lattice constant of said first semiconductor material.

8. The semiconductor structure of claim 1, wherein said second semiconductor material has an epitaxial relationship with said first semiconductor material.

9. The semiconductor structure of claim 1, wherein said strain relaxed buffer layer has an entirely planar topmost surface.

10. The semiconductor structure of claim 1, wherein each recessed region is circular, triangular or a parallelogram having four sides.

11. The semiconductor structure of claim 1, wherein said strain relaxed buffer layer has a thickness from 100 nm to 2000 nm.

12. The semiconductor structure of claim 1, wherein said strain relaxed buffer layer is a silicon germanium alloy in which 80 percent to 100 percent of a compressive strain is relaxed.

13. The semiconductor structure of claim 1, wherein said misfit dislocations are located along horizontal surfaces of said first semiconductor material.

14. The semiconductor structure of claim 1, further comprising a semiconductor device located upon each first region.

15. The semiconductor structure of claim 14, wherein said semiconductor device is a field effect transistor.

16. The semiconductor structure of claim 1, wherein said threading dislocation defects extend upward from said misfit dislocation defects to a topmost surface of said strain relaxed buffer layer.

* * * * *